United States Patent [19]
Kawakita et al.

[11] Patent Number: 6,060,761
[45] Date of Patent: *May 9, 2000

[54] LATERAL TYPE TRANSISTOR

[75] Inventors: Keisuke Kawakita; Takahiro Yashita, both of Tokyo, Japan

[73] Assignees: Mitsubishi Denki Kabushiki Kaisha; Mitsubishi Electric Engineering Co., Ltd., both of Tokyo, Japan

[*] Notice: This patent is subject to a terminal disclaimer.

[21] Appl. No.: 09/048,094

[22] Filed: Mar. 26, 1998

Related U.S. Application Data

[63] Continuation of application No. 08/577,373, Dec. 22, 1995, Pat. No. 5,783,855.

[30]    Foreign Application Priority Data

Aug. 18, 1995  [JP]  Japan ................................. 7-210609

[51] Int. Cl.$^7$ ............................. H01L 29/00; H01L 23/58
[52] U.S. Cl. .................... 257/557; 257/560; 257/561; 257/565; 257/578; 257/563
[58] Field of Search ................................. 257/557, 560, 257/561, 565, 578, 563

[56]           References Cited

U.S. PATENT DOCUMENTS 5,200,803  4/1993  Leduc ...................................... 257/560
5,783,855  7/1998  Kawakita et al. ...................... 257/560

FOREIGN PATENT DOCUMENTS 0322962  7/1989  European Pat. Off. .

*Primary Examiner*—Olik Chaudhuri
*Assistant Examiner*—S H Rao
*Attorney, Agent, or Firm*—Leydig, Voit & Mayer

[57]           ABSTRACT

A lateral transistor includes a semiconductor substrate of a first conductivity type having a major surface; an emitter region of a second conductivity type in the semiconductor substrate on the major surface of the semiconductor substrate; a collector region of a second conductivity type in the semiconductor substrate on the major surface of the semiconductor substrate, spaced from and surrounding the emitter region, and including sides and corners; an electrically insulating layer on the major surface of the semiconductor substrate and including a first penetrating hole extending to the collector region except at a first of the corners and a second penetrating hole extending to the emitter region; a collector electrode contacting the collector region through the first penetrating hole and surrounding the emitter region except at the first corner; an emitter electrode at the same level as the collector electrode and contacting the emitter region through the second penetrating hole; and an emitter wiring layer at the same level as the emitter electrode, disposed on the insulating layer, and extending from the emitter electrode across the first corner.

8 Claims, 10 Drawing Sheets

LATERAL TYPE TRANSISTOR

This application is continuation of U.S. Ser. No. 08/577,373, filed Dec. 22, 1995, now U.S. Pat. No. 5,783,855.

BACKGROUND OF THE INVENTION

1. Field of the Invention

The invention relates to a lateral transistor from which a metal layer and/or a semiconductor region at one of the corners of a collector region surrounding an emitter region are/is removed and a metal layer for drawing a current from the emitter is disposed at the corner.

2. Description of the Prior Art

FIGS. 7A and 7B show a conventional single-element lateral transistor. The configuration of FIGS. 7A and 7B comprises an n-type semiconductor layer 1, a collector region 2, namely a p-type semiconductor region in the n-type semiconductor layer 1, an emitter 3, namely a p-type semiconductor region in the n-type semiconductor layer 1, an insulating layer 4 that covers the surface of the n-type semiconductor layer 1, a collector electrode 5 on the surface of the insulating layer 4 and extending through a hole penetrating through the insulating layer 4, an insulating layer 6 that covers the insulating layer 4 and the collector electrode 5, and an emitter electrode 7 extending from the emitter region 3.

In this conventional lateral transistor, an n-type base region is disposed between the periphery of the emitter region 3 and the square, doughnut-shaped collector region 2 that surrounds the emitter region 3. The transistor includes the collector region 2, the n-type semiconductor layer 1, and the emitter region 3. Such a lateral transistor requires an electrode extending from the central emitter region 3. In the conventional transistor, a middle portion of the square collector electrode 5 is removed and an emitter electrode 7 is located along the removed portion.

FIGS. 8A and 8B show another conventional single-element lateral transistor. Explanation of the elements of FIGS. 8A and 8B is omitted because the same numerals as in FIGS. 7A and 7B denote the same elements or components. In the lateral transistor shown in FIGS. 8A and 8B, an n-type base region is disposed between the periphery of emitter region 3 and the square, doughnut-shaped collector region 2 that surrounds the emitter region 3. Further, in such a lateral transistor, a metal layer 7 extends through a penetrating hole in both the insulating layer 4 and the overlying insulating layer 6 without removal of the metal 5 at any sides of the square collector electrode 5. This metal layer 7 is disposed on insulating layer 6 as an emitter electrode.

FIGS. 9A and 9B show another lateral transistor wherein a plurality of prior art elements constitute a unit transistor, and the unit transistors are connected in parallel. The conventional lateral transistor shown in FIGS. 9A and 9B includes a plurality of lattice-shaped transistor cells. In each transistor cell, an n-type base region is disposed between the periphery of emitter region 3 and the square, doughnut-shaped collector region 2 surrounding the emitter region 3. The collector region 2, the n-type base region, and the emitter region 3 constitute a transistor. Connecting a plurality of unit transistors in parallel increases power handling capacity.

In order to connect the plurality of unit transistors, the metal layer 7 is disposed in penetrating holes opened in the both insulating layer 4 and the overlying insulating layer 6 without removing metal portions at each side of the square collector electrode 5, as FIGS. 9A and 9B show. The emitters in each transistor cell are connected via this metal layer 7.

FIGS. 10A and 10B show a lateral transistor wherein a unit transistor includes a plurality of elements of the prior art, and the unit transistors are connected in parallel. In the structures of FIGS. 10A and 10B, it is possible simply to open penetrating holes in both the insulating layer 4 and the insulating layer 6 which overlay the emitter region 3 and to connect the emitter regions 3 of a plurality of transistor cells mutually by multi-layer interconnections through these penetrating holes.

However, in the conventional lateral transistor shown in FIGS. 7A and 7B, a metal portion in one side of the collector electrode 5 is removed so the emitter electrode 7 can extend along that portion. If that portion of collector electrode 5 is removed, the operational area of the lateral transistor is reduced because the transistor operates mainly at the periphery of the central emitter region 3 and the surrounding collector region 2. Accordingly, in this configuration, a power transistor cannot achieve sufficiently large power capacity.

The conventional lateral transistor shown in FIGS. 8A and 8B includes the insulating layer 6 over the collector electrode 5 without removal of a metal portion at one side of the collector electrode 5. The emitter electrode 7 is drawn out on the top surface of the insulating layer 6 through a penetrating hole opened in the insulating layer 4 and the overlying insulating layer 6. Although the current capacity per transistor cell is enlarged, since the collector electrode 5 can be drawn out from each of the four sides of the collector region 2 in the transistor cell, additional process steps are required to open the penetrating holes in the insulating layer 6. Moreover, the dimensions of the emitter must be enlarged. Accordingly, such a transistor is less advantageous in reducing the size of the transistor.

The conventional lateral transistor shown in FIGS. 9A and 9B includes the insulating layer 6 over the collector electrode 5 without removal of a metal portion at one side of the collector electrode 5. The emitter electrode 7 is drawn out on the top surface of the insulating layer 6 through penetrating holes opened in insulating layer 4 and the overlying insulating layer 6, mutually connecting each emitter in each transistor cell. In this configuration, the current capacity per transistor cell is enlarged because the collector electrode 5 can be drawn out from each of the four sides of collector region 2 in the transistor cell. However, the opening in the insulating layer 4 and the overlying insulating layer 6 must be enlarged because it is difficult to contact a diffused region with aluminum when electrodes are drawn out from the diffused region. For this reason, the dimensions of the emitters must also be enlarged. Accordingly, such a transistor is less advantageous in reducing the size of the transistor.

Further, in the configuration of FIGS. 10A and 10B, each transistor cell is inevitably large because the dimension of the emitter is enlarged. Accordingly, such a transistor is less advantageous in shrinking the size of a chip.

SUMMARY OF THE INVENTION

It is an object of the present invention to provide a high power lateral transistor.

It is further object of the present invention to provide a small lateral transistor by locating an emitter electrode directly on an insulating layer.

It is another object of the present invention to provide a lateral transistor in which no parasitic metal-oxidesemiconductor transistor is formed by removing a collector region and/or a collector electrode at one corner of a collector.

According to a first aspect of the present invention, a lateral transistor comprises a first semiconductor region in a semiconductor layer, a second semiconductor region separated from the first semiconductor region and surrounding the first semiconductor region, a first insulating layer covering the semiconductor layer, and a first metal layer electrically connected to the second semiconductor region through a penetrating hole in the first insulating layer wherein one corner of the first metal layer is removed, and a second metal layer on the first insulating layer in a penetrating hole in the insulating layer is drawn out diagonally from the first semiconductor region along the corner.

According to a second aspect of the present invention, a lateral transistor comprises a first semiconductor region in a semiconductor layer, a second semiconductor region separated from the first semiconductor region and surrounding the first semiconductor region, a first insulating layer covering the semiconductor layer, and a first metal layer electrically connected to the second semiconductor region through a penetrating hole in the first insulating layer. Corners of the second semiconductor region and the first metal layer are removed, and a second metal layer on the first insulating layer and in a penetrating hole in the insulating layer is drawn out diagonally from the first semiconductor region along the corner.

According to a third aspect of the present invention, a lateral transistor comprises a unit transistor including a pair of transistor cells, each cell comprising a first semiconductor region in a semiconductor layer, a second semiconductor region separated from the first semiconductor region and surrounding the first semiconductor region, a first insulating layer covering the semiconductor layer, and a first metal layer electrically connected to the second semiconductor regions through a penetrating hole in the first insulating layer. A corner of the first metal layer where the two transistor cells intersect is removed; a second metal layer located on the first insulating layer, and in a penetrating hole in the insulating layer, is drawn out diagonally and connects the respective first semiconductor regions of the unit transistors along the corner; and the second metal layer is connected to another metal layer through a penetrating hole in a second insulating layer overlying the first insulating layer, and a plurality of unit transistors are connected in parallel via the other metal layer.

According to a fourth aspect of the present invention, a lateral transistor comprises a unit transistor including a pair of transistor cells, each cell comprising a first semiconductor region in a semiconductor layer, a second semiconductor region separated from and surrounding the first semiconductor region, a first insulating layer covering the semiconductor layer, and a first metal layer electrically connected to the second semiconductor region through a penetrating hole in the first insulating layer. Corners of the second semiconductor layer and the first metal layer where the two transistor cells intersect are removed, a second metal layer on the first insulating layer and in a penetrating hole in the insulating layer is drawn out diagonally and connects the respective first semiconductor regions of the unit transistors along the corner, and another metal layer connected to the second metal layer is drawn out through a penetrating hole in a second insulating layer and connects other unit transistors in parallel.

According to a fifth aspect of the present invention, a lateral transistor comprises a unit transistor, each unit transistor including two pairs of two transistor cells, each cell comprising a first semiconductor region in first semiconductor layer, a second semiconductor region separated from the first semiconductor region and surrounding the first semiconductor region, a first insulating layer covering the semiconductor layer, and a first metal layer electrically connected to the second semiconductor region through a penetrating hole in the first insulating layer. One corner of the first metal layer where the four transistor cells intersect is removed, two second metal layers are located on the first insulating layer through a penetrating hole in the insulating layer, and each second metal layer is drawn out diagonally to connect the respective first semiconductor regions of the pair of transistors along the corner. The second metal layer is connected with another metal layer through a penetrating hole in a second insulating layer overlying the first insulating layer, and a plurality of unit transistors are connected in parallel via the other metal layer.

According to a sixth aspect of the present invention, a lateral transistor comprises a unit transistor, each unit transistor including two pairs of two transistor cells, each cell comprising a first semiconductor region in a semiconductor layer, a second semiconductor region separated from the first semiconductor region and surrounding the first semiconductor region, a first insulating layer covering the semiconductor layer, and a first metal layer electrically connected to the second semiconductor region through a penetrating hole in the first insulating layer. Corners of the second semiconductor region and the first metal layer where the four transistor cells intersect are removed; two second metal layers are located on the first insulating layer in a penetrating hole in the insulating layer, and each second metal layer is drawn out diagonally, connecting the respective first semiconductor regions of a pair of transistors along the corner; and the second metal layer is connected to another metal layer through a penetrating hole in a second insulating layer overlying the first insulating layer, and a plurality of unit transistors are connected in parallel via the other metal layer.

DETAILED DESCRIPTION OF PREFERRED EMBODIMENTS

Embodiment 1

Figure 1A:
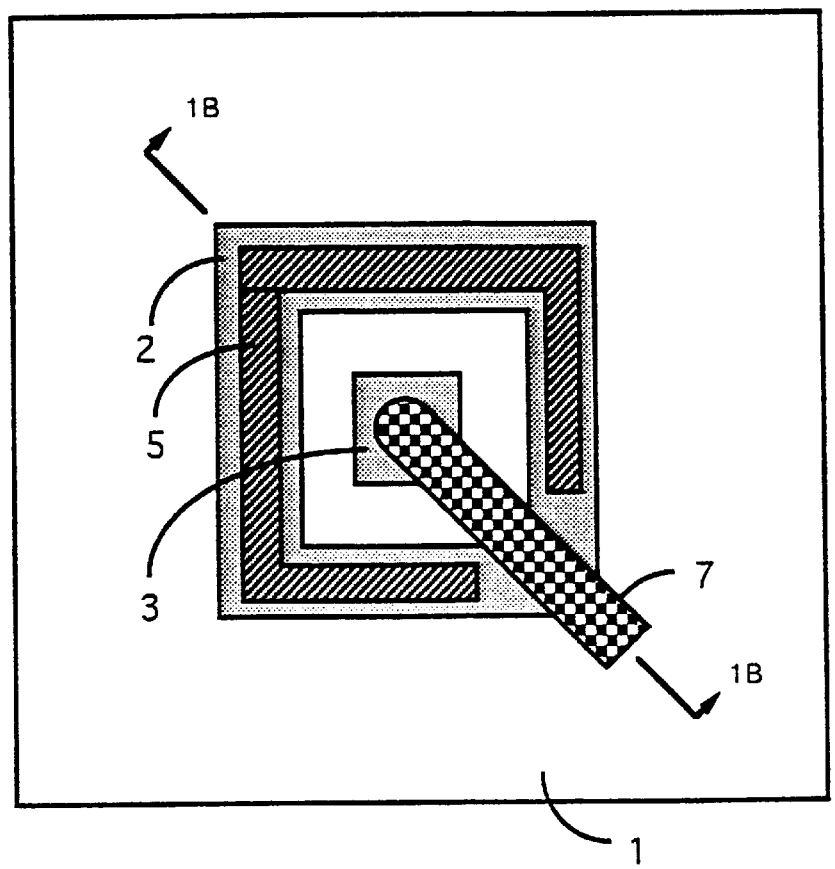
FIGS. 1A and 1B show a lateral transistor having a single transistor cell according to a first embodiment of the present invention.
Figure 1B:
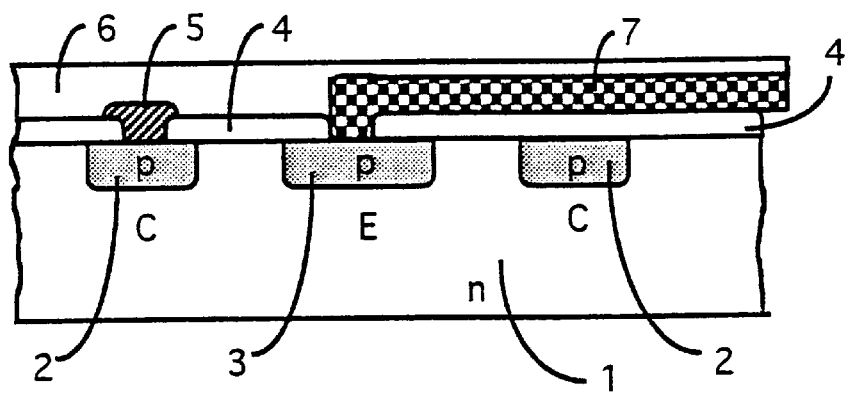

FIGS. 1A and 1B show a single-element lateral transistor according to a first embodiment of the present invention. The configuration in FIGS. 1A and 1B comprises n-type semiconductor layer 1, a collector region 2, namely, a p-type semiconductor region in the n-type semiconductor layer 1, an emitter region 3, namely, a p-type semiconductor region in the n-type semiconductor layer 1, an insulating layer 4 that covers the n-type semiconductor layer 1, a collector electrode 5 disposed on the outer surface of the insulating layer 4 and including a penetrating hole, an insulating layer 6 that covers the insulating layer 4 and the collector electrode 5, and an emitter electrode 7 extending from the emitter region 3.

In FIGS. 1A and 1B, one of the corners is removed from the collector electrode 5. The emitter electrode 7 is disposed on the insulating layer 4, in the penetrating hole in the insulating layer 4, and extends diagonally toward the corner, as the cross-sectional view of FIG. 1B taken along line 1B—1B of FIG. 1A shows.

The corners of the collector region 2 are farther from the emitter region 3 than are the sides of the collector region 2. Therefore, the transistor is less efficient in the corners than along the sides. In this embodiment, the entire transistor efficiency can be retained if metal is removed from one corner of the collector where the transistor is less efficient. Further, compared with the prior art, the emitter region 3 is smaller since the emitter electrode 7 is directly on the insulating layer 4, so that a small lateral transistor can be manufactured.

Embodiment 2

Figure 2A:
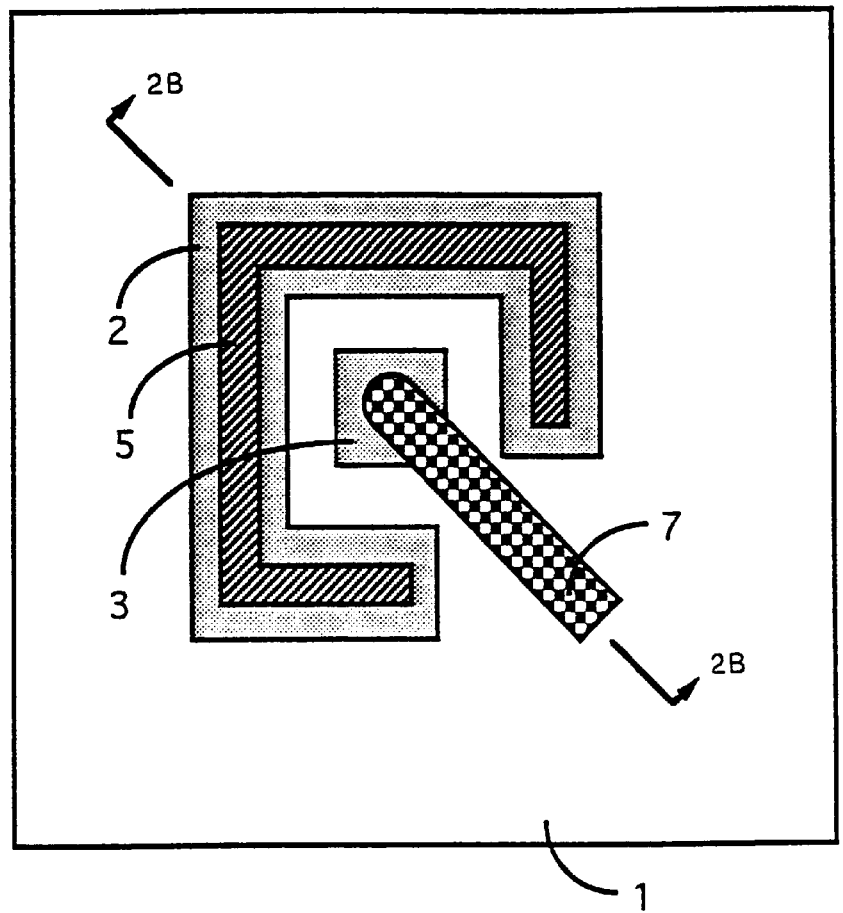
FIGS. 2A and 2B show a lateral transistor having a single transistor cell according to a second embodiment of the present invention.
Figure 2B:
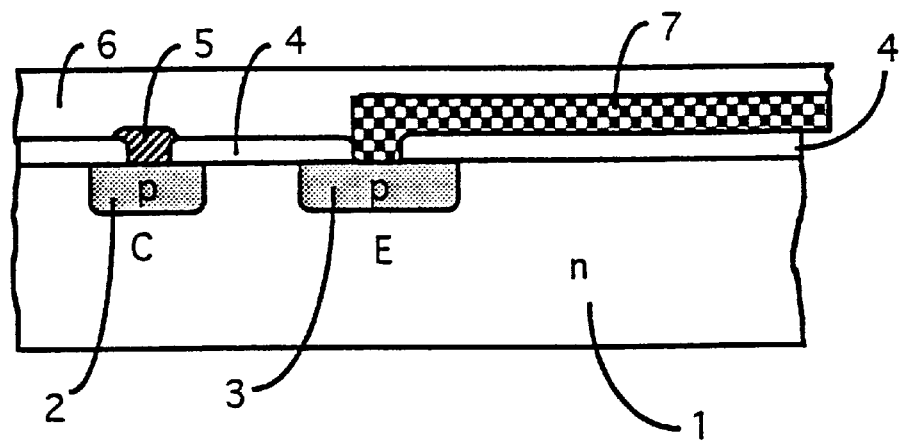

FIGS. 2A and 2B show a single-element lateral transistor according to a second embodiment of the present invention. In FIGS. 2A and 2B, the same numerals as in FIGS. 1A and 1B denote the same elements or components, so a duplicate explanation of them is omitted. The collector region 2 in one of the corners is removed as is the collector electrode 5 at the same corner, as shown in the cross-sectional view of FIG. 2B taken along line 2B—2B in FIG. 2A. In this process, no part of the collector region 2 is present at one of the corners, as FIGS. 2A and 2B show, compared to the first embodiment. The emitter electrode 7 is disposed on the insulating layer 4, extends through the penetrating hole in insulating layer 4, and is drawn out diagonally from the semiconductor region 3 toward the corner.

The corners of the collector region 2 are farther from the emitter region 3 than from the sides of the collector region 2. Therefore, the transistor is less efficient in the corners than at the sides. In this embodiment, the entire transistor efficiency can be retained if the collector region 2 and the metal layer 5 are removed from one corner of the collector where the transistor is less efficient. Further, compared with the prior art, the emitter region 3 is smaller since the emitter electrode 7 is located directly on the insulating layer 4, making manufacture of a small lateral transistor possible. Moreover, a parasitic metal-oxide-semiconductor transistor is not formed because the collector region 2 is not present at the corner, as FIGS. 2A and 2B show.

Embodiment 3

Figure 3A:
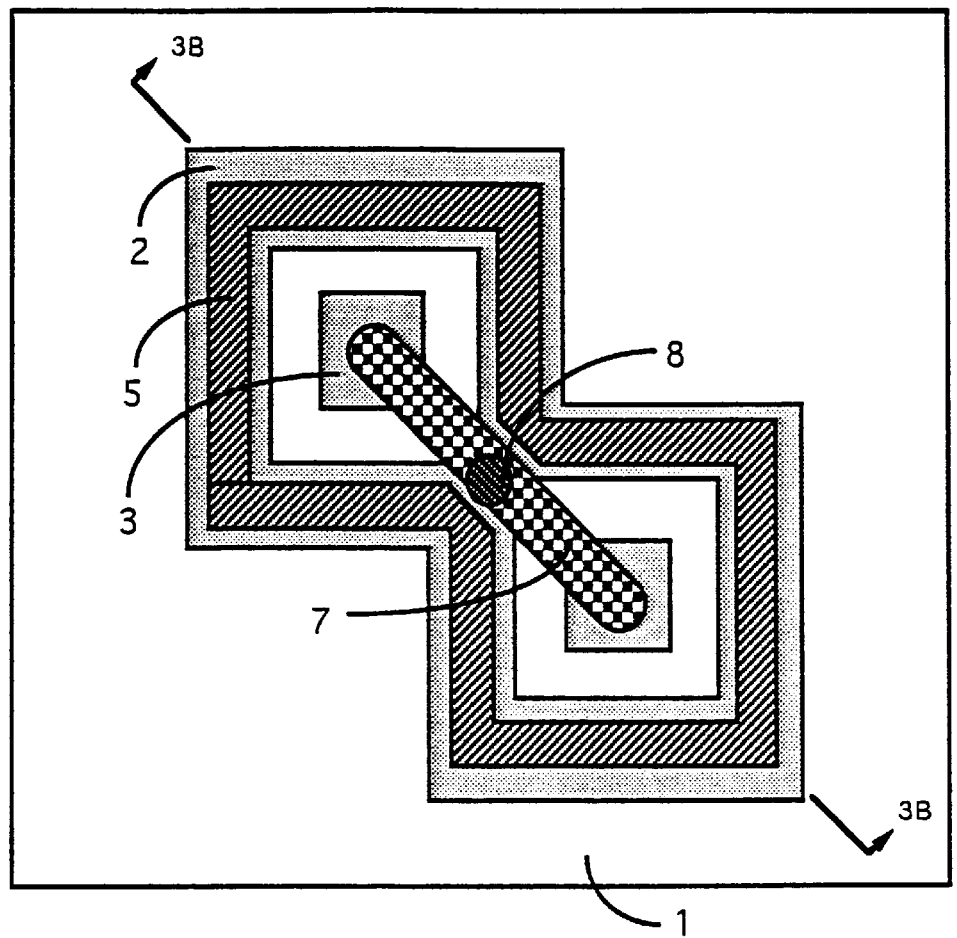
FIGS. 3A and 3B show a lateral transistor having two transistor cells according to a third embodiment of the present invention.
Figure 3B:
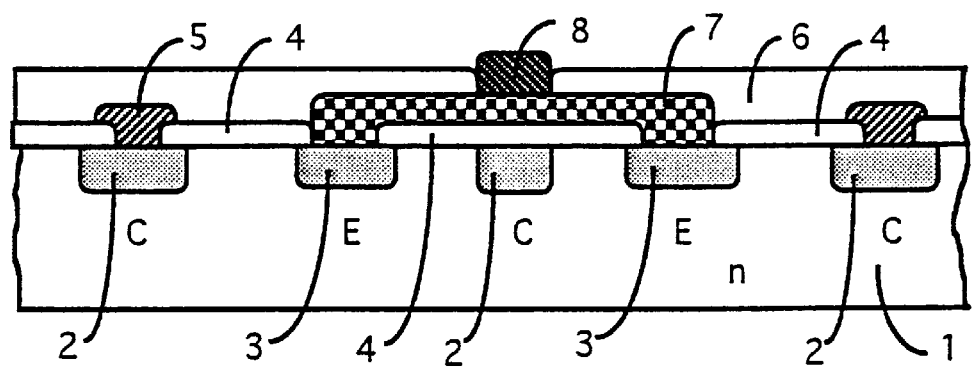

FIGS. 3A and 3B show a pair of two-element lateral transistors according to a third embodiment of the present invention. In FIGS. 3A and 3B, the same numerals as those in FIGS. 1A and 1B denote the same elements or components, so a duplicate explanation of them is omitted. In FIGS. 3A and 3B, two transistor cells, each of which consists of a unit transistor, are mutually connected via the emitter electrode 7. A plurality of such unit transistors connected in parallel provides a lateral transistor having a large power handling capacity.

In FIGS. 3A and 3B, the collector electrode 5 at a corner where the two transistor cells intersect is removed. The collector electrode 5 is not present at the corner although the collector region 2 is present, as shown in the cross-sectional view taken along line 3B—3B of FIG. 3A. The emitter electrode 7 is drawn out diagonally from the emitter region 3 of one transistor toward the emitter of the other transistor along one corner on the insulating layer 4 and in penetrating holes in the insulating layer 4. Each penetrating hole is at each respective transistor in the insulating layer 6, connecting the emitter electrode 7. The emitter electrode connects each transistor in a pair of unit transistors as well as the metal layer 8. One unit transistor is connected in parallel to the other unit transistor through the metal layer 8.

The corners of the collector regions 2 are farther from the emitter region 3 than from the sides of the collector region 2. Therefore, operational characteristics of the transistors are less efficient in the corners than at the sides. In this embodiment, the entire transistor efficiency can be retained if metal is removed from one corner of the collector where operational characteristics are less efficient. Further, compared with the prior art, the emitter region 3 is smaller since the emitter electrode 7 can be located directly on the insulating layer 4, so that a small lateral transistor can be manufactured. Moreover, a unit transistor may be made smaller by mutually connecting two lateral transistor cells where the collector electrode has been removed.

Embodiment 4

Figure 4A:
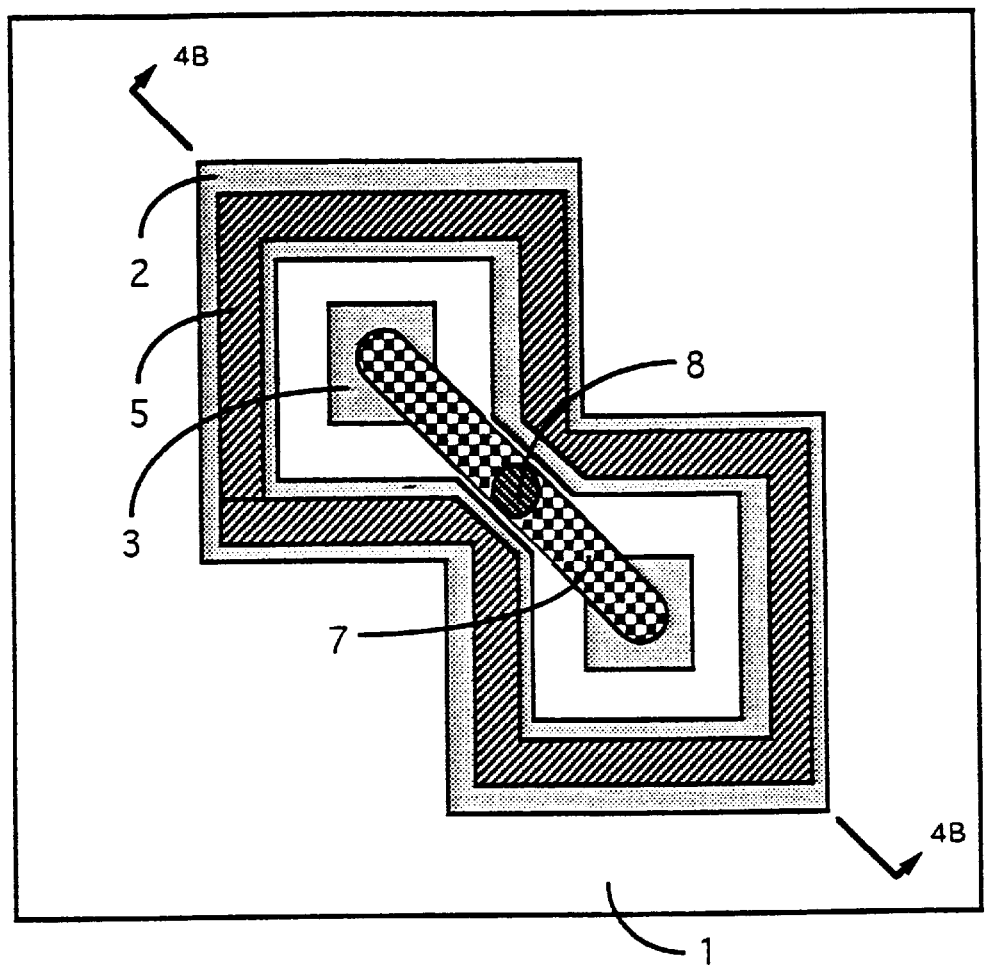
FIGS. 4A and 4B show a lateral transistor having two transistor cells according to a fourth embodiment of the present invention.
Figure 4B:
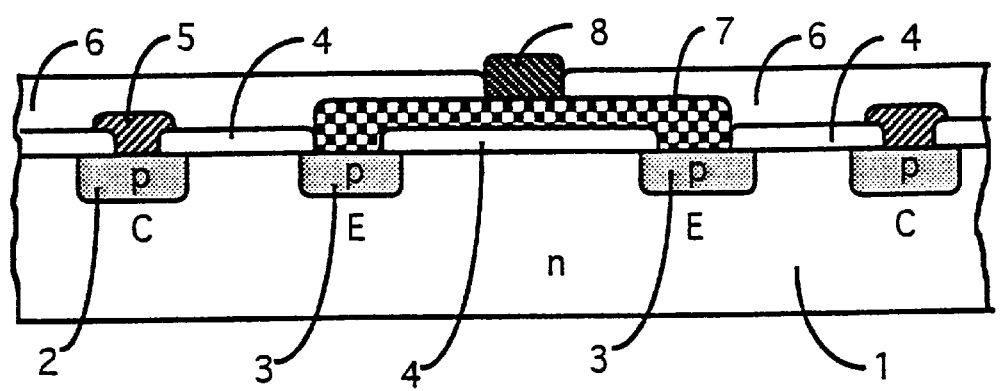

FIGS. 4A and 4B show a pair of two-element lateral transistors according to a fourth embodiment of the present invention. The configuration of FIGS. 4A and 4B comprises a connection metal layer 8 that is connected with the emitter electrode 7 through a penetrating hole in the insulating layer 6. In FIGS. 4A and 4B, the numerals that are the same as those in FIGS. 1A and 1B denote the same elements or components, so a duplicate explanation of them is omitted. In FIGS. 4A and 4B, two transistor cells, each of which consists of a unit transistor, are connected mutually via the emitter electrode 7. A plurality of such unit transistors connected in parallel constitute a lateral transistor having a large power handling capacity.

In FIGS. 4A and 4B, the collector region 2 and the collector electrode 5 at a corner where two transistor cells intersect are removed. Because of this process, neither the collector electrode 5 nor the collector region 2 is located at the corner, as shown in the cross-sectional view taken along line 4B—4B of FIG. 4A. The emitter electrode 7 is drawn out diagonally from the emitter region 3 of one transistor toward the emitter region of the other transistor along one corner and located on the insulating layer 4, through penetrating holes in the insulating layer 4. A penetrating hole at each respective transistor is opened in the insulating layer 6 for connecting the emitter electrode 7. The emitter electrode connects each transistor in a pair of unit transistors as well as the metal layer 8. One unit transistor is connected to the other unit transistor in parallel through the metal layer 8.

The corners of the collector region 2 are farther from the emitter region 3 than from the sides of the collector region 2. Therefore, operational characteristics of the transistor are less efficient in the corners than at the sides. In this embodiment, the entire transistor efficiency can be maintained if the collector region 2 and the metal layer 5 are removed from one corner of the collector where operational characteristics are less efficient. Further, compared with the prior art, the emitter region 3 is smaller since the emitter electrode 7 is located directly on the insulating layer 4, which makes manufacture of a small lateral transistor possible. Moreover, a unit transistor may be made smaller by mutually connecting two-element lateral transistors via the portions where the collector electrodes 5 have been removed. A parasitic metal oxide semiconductor transistor is not formed because the collector region 2 is not present at the corner, as FIGS. 4A and 4B show. Moreover, a unit transistor may be made smaller by mutually connecting two-element lateral transistors where the collector electrode 5 has been removed.

Embodiment 5

Figure 5A:
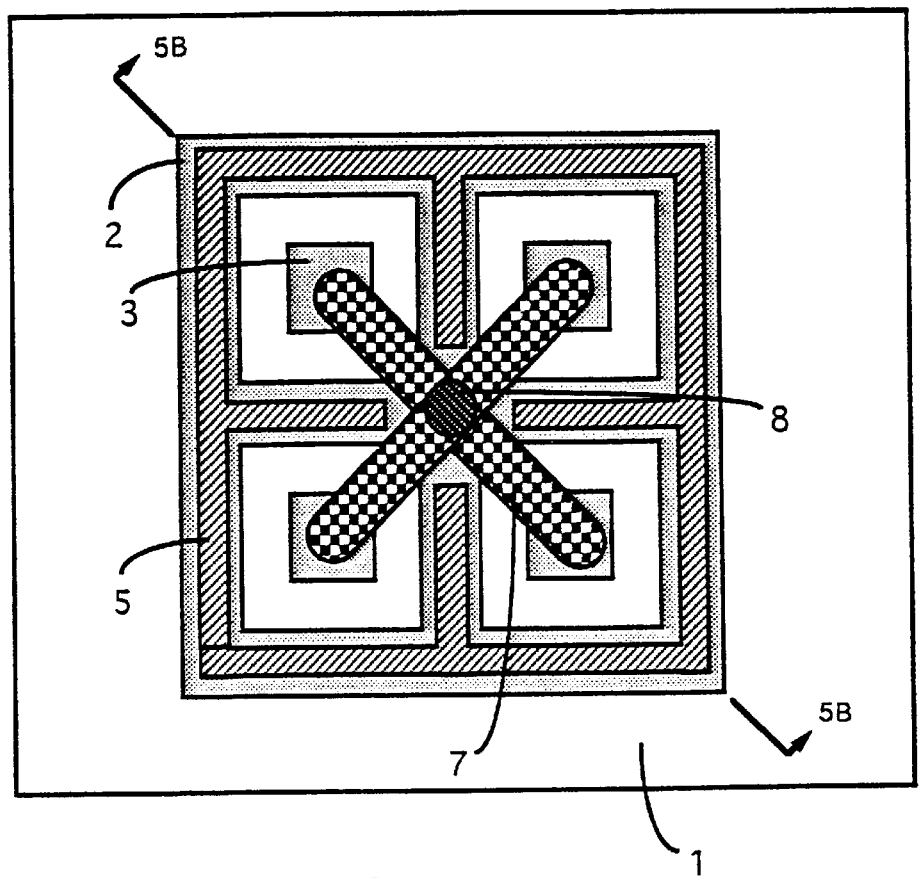
FIGS. 5A and 5B show a lateral transistor having a plurality of transistor cells according to a fifth embodiment of the present invention.
Figure 5B:
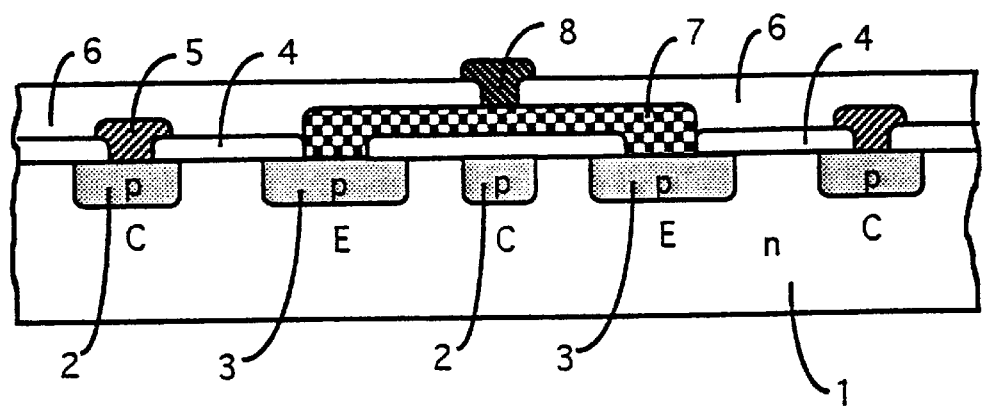

FIGS. 5A and 5B show a multiple-element lateral transistor according to a fifth embodiment of the present invention. In FIGS. 5A and 5B, the numerals that are the same as those in FIGS. 1A and 1B denote the same elements or components, so duplicate explanation of them is omitted. In FIGS. 5A and 5B, the emitter regions 3 and four transistor cells are connected via the emitter electrode 7 as a unit transistor. A plurality of unit transistors connected in parallel constitute a lateral transistor having a large power handling capacity.

In FIGS. 5A and 5B, the collector electrode 5 at a corner where four transistor cells intersect is removed. Because of this process, the collector electrode 5 is not present at the corner although the collector regions 2 are present, as the cross-sectional view taken along line 5B—5B of FIG. 5A shows. The emitter electrode 7 extends diagonally along a center portion on the insulating layer 4 through a penetrating hole in the insulating layer 4. Respective emitter regions 3 in respective transistor cells that diagonally face each other are connected by the emitter electrode 7. In the same manner, the emitter regions in the rest of the transistor cells that diagonally face each other are connected with each other via the emitter electrode 7. Accordingly, four emitter regions 3 are connected via the emitter electrode 7. A penetrating hole in the insulating layer 6 connects each emitter region of a pair of unit transistors in parallel, using the emitter electrode 7 via the metal layer 8.

The corners of the collector region 2 are farther from the emitter region 3 than from the side of the collector region 2. Therefore, operational characteristics of the transistor are less efficient in the corners than along the sides. In this embodiment the entire transistor efficiency can be retained if metal is removed from one corner of the collector where operational characteristics are less efficient. Further, compared with the prior art, the emitter region 3 is smaller since the emitter electrode 7 can be located directly on the insulating layer 4, making manufacture of a small lateral transistor possible. Moreover, a unit transistor may be made smaller by connecting two-element lateral transistors mutually where the collector electrode 5 has been removed.

Embodiment 6

Figure 6A:
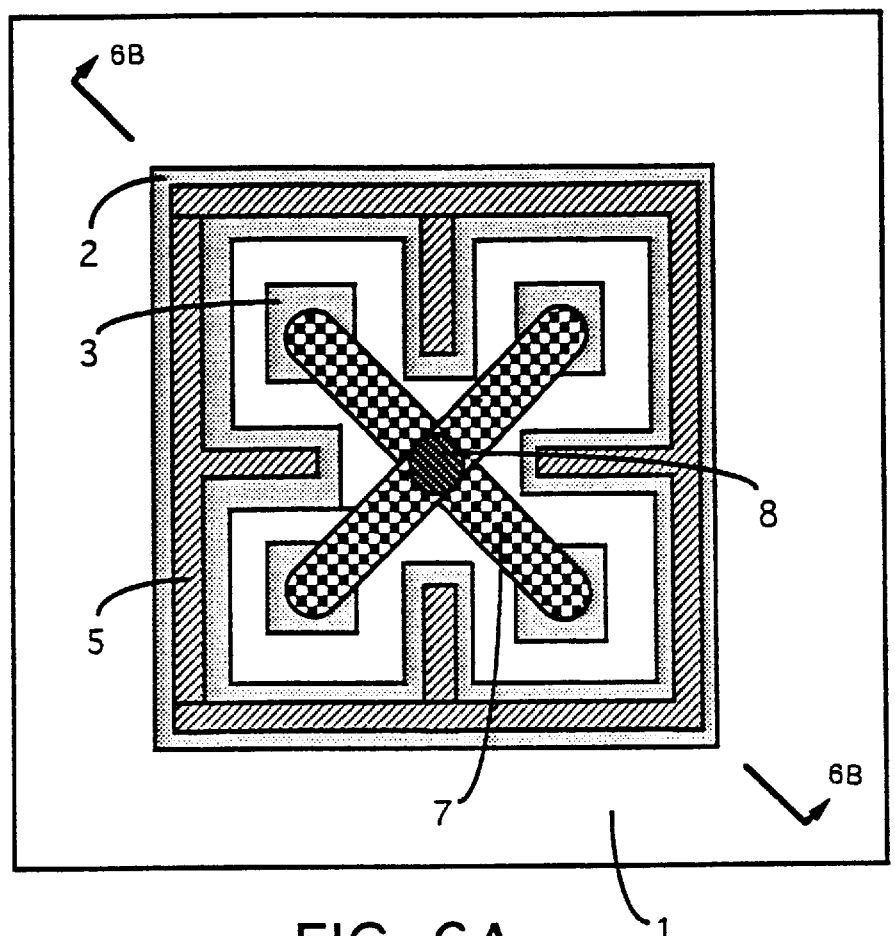
FIGS. 6A and 6B show a lateral transistor having a plurality of transistor cells according to a sixth embodiment of the present invention.
Figure 6B:
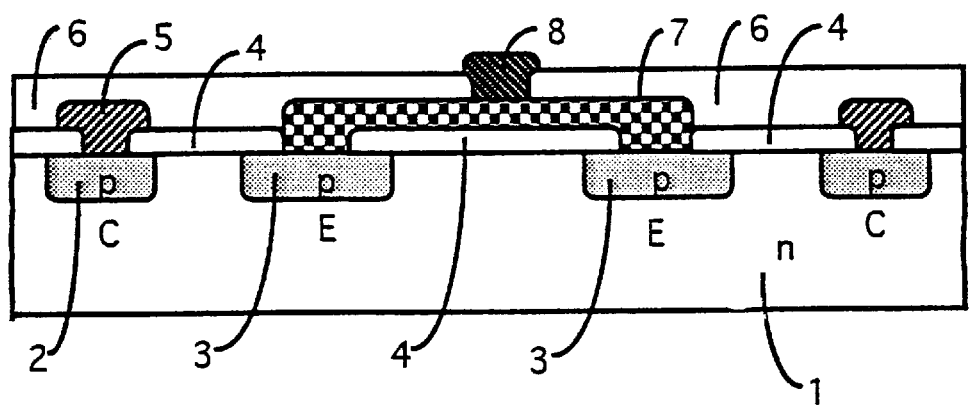
Figure 7A:
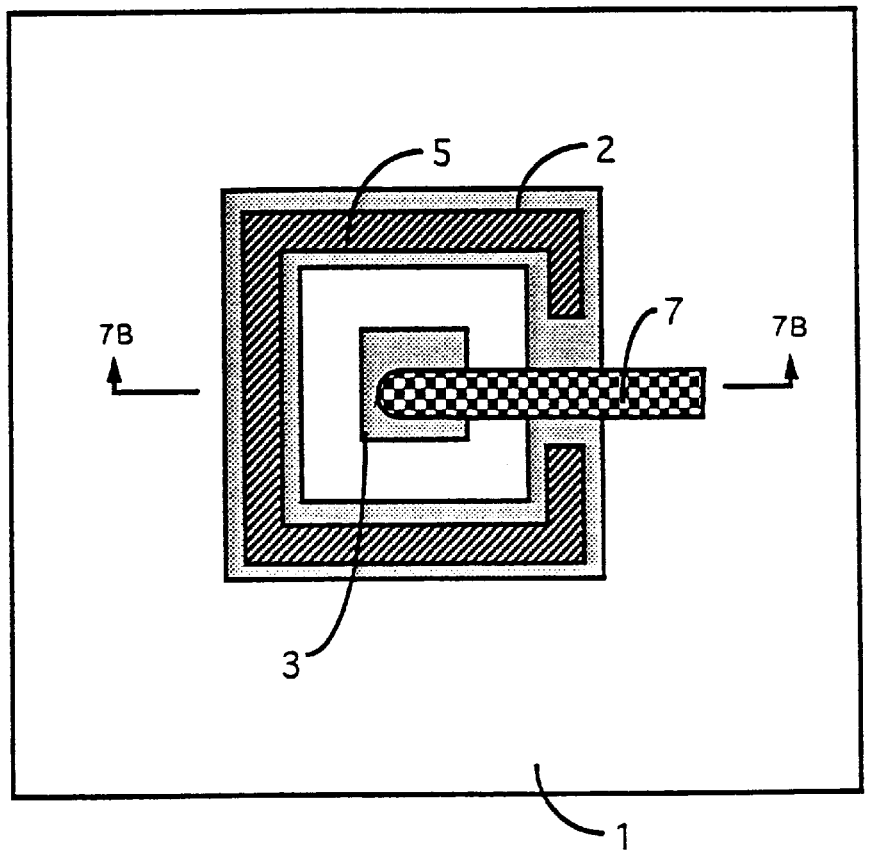
FIGS. 7A and 7B show a lateral transistor having a single transistor cell in the prior art.
Figure 7B:
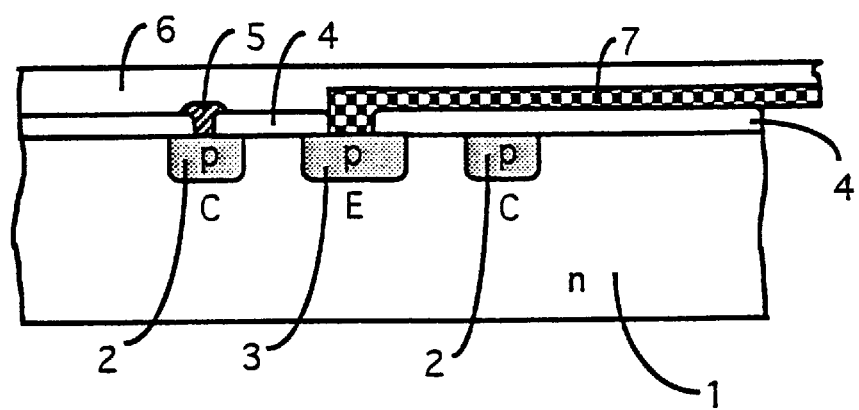
Figure 8A:
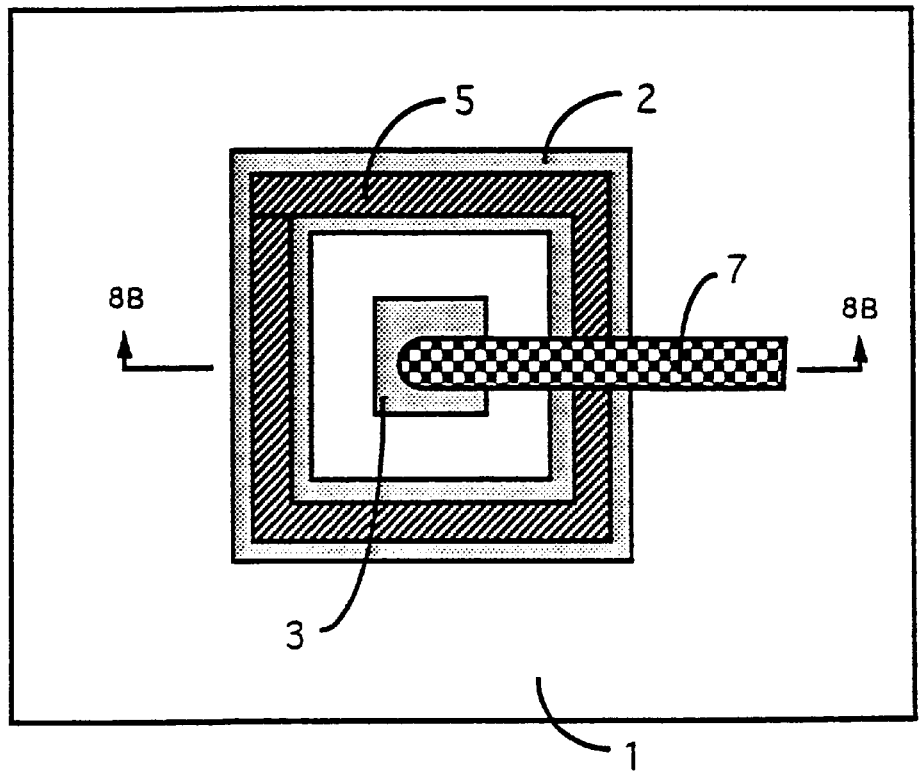
FIGS. 8A and 8B show a prior art lateral transistor having a single transistor cell.
Figure 8B:
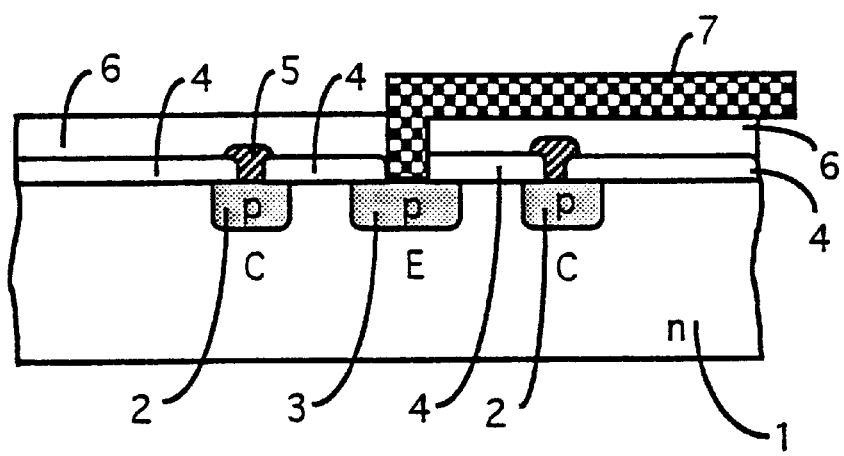
Figure 9A:
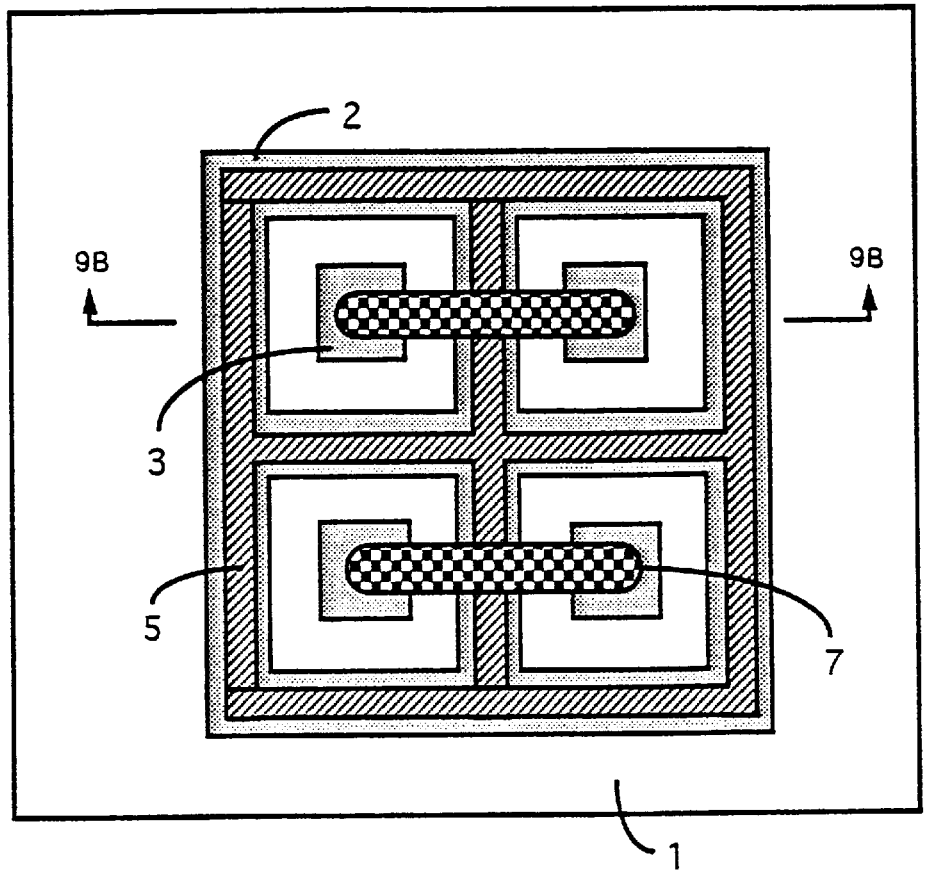
FIGS. 9A and 9B show a prior art lateral transistor having a plurality of transistor cells.
Figure 9B:
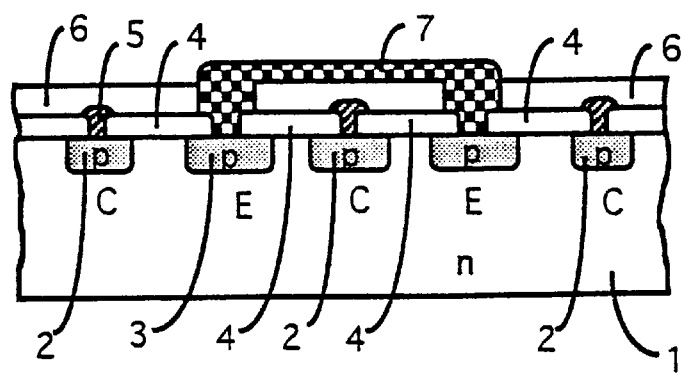
Figure 10A:
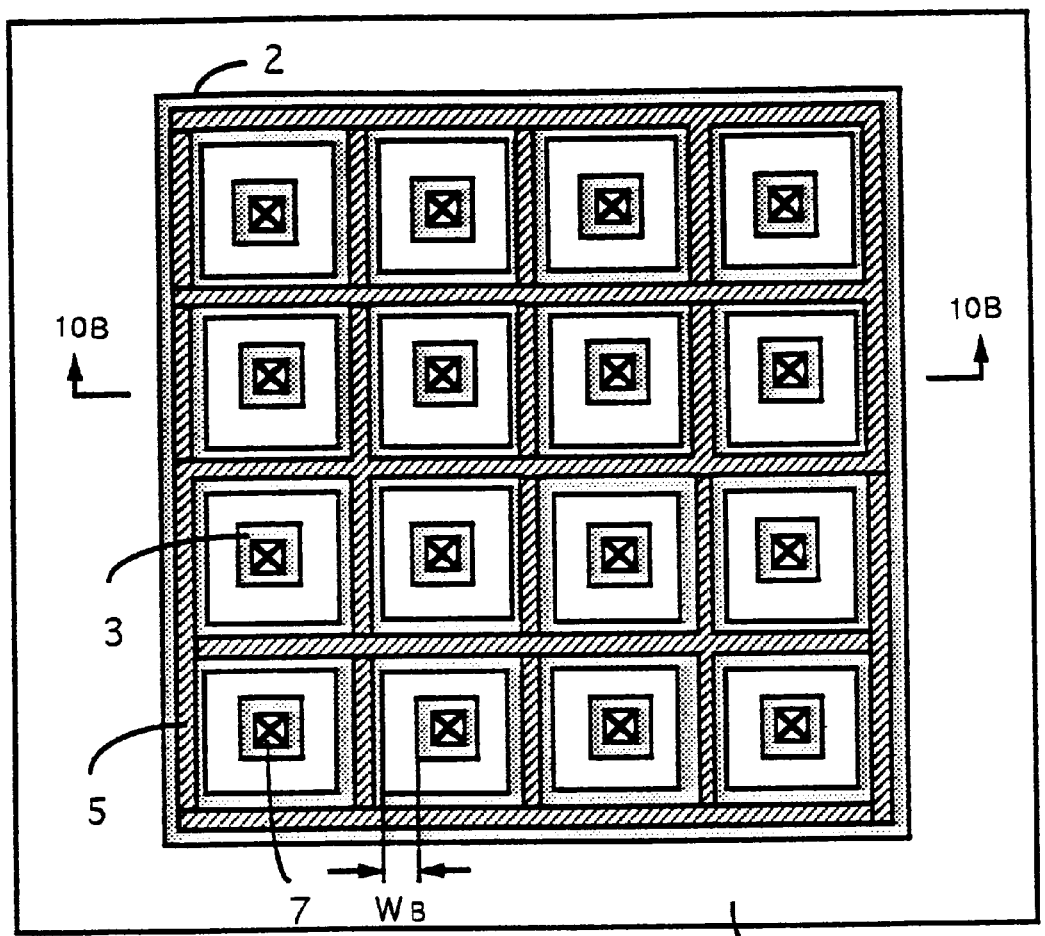
FIGS. 10A and 10B show a prior art lateral transistor having a plurality of transistor cells.
Figure 10B:
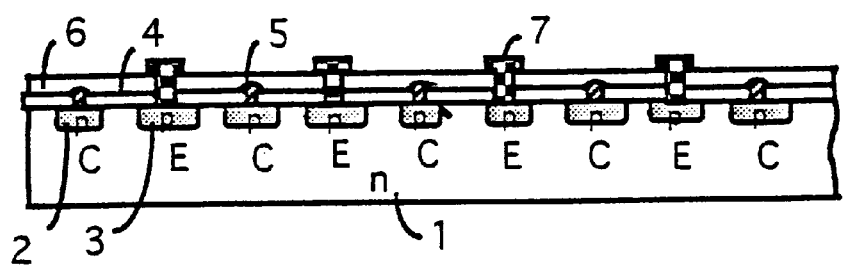

FIGS. 6A and 6B show a multiple-element lateral transistor according to a sixth embodiment of the present invention. In FIGS. 6A and 6B, the numerals that are the same as those in FIGS. 4A and 4B denote the same elements or components, so a duplicate explanation of them is omitted. In FIGS. 6A and 6B, each of the emitter regions 3 in the four transistor cells connected via the emitter electrode 7 constitute a unit transistor. A plurality of unit transistors connected in parallel constitute a lateral transistor having a large power handling capacity.

In FIGS. 6A and 6B, the collector region 2 and the collector electrode 5 at a corner where two transistor cells intersect are removed. Because of this process, neither the collector electrode 5 nor the collector region 2 is present at the corner, as the cross-sectional view taken along line 6B—6B of FIG. 6A shows. The emitter electrode 7 extends diagonally from emitter region 3 of one transistor toward that of another transistor along one corner on the insulating layer 4 and through penetrating holes in the insulating layer 4. In the same manner, the emitter regions in the rest of the transistor cells that are diagonally facing each other are connected with each other via the emitter electrode 7. Accordingly, four emitter regions 3 are connected via the emitter electrode 7. A penetrating hole in the insulating layer 6 is used to connect each emitter region in a pair of unit transistors in parallel using the emitter electrode 7 on the metal layer 8.

The corners of the collector region 2 are farther from the emitter region 3 than from the sides of the collector region 2. Therefore, operational characteristics of the transistor are less efficient in the corners than along the sides. In this embodiment, the entire transistor efficiency can be retained if the collector region 2 and the metal layer 5 are removed from one corner of the collector where operational characteristics are less efficient. Further, compared with the prior art, the emitter region 3 is smaller since the emitter electrode 7 is located directly on the insulating layer 4, which makes manufacture of a small lateral transistor possible. Moreover, a parasitic metal oxide semiconductor transistor is not formed because the collector region 2 and the collector electrode 5 are not present at the corner, as FIGS. 6A and 6B show.

What is claimed is:

1. A lateral transistor comprising:

a semiconductor substrate of a first conductivity type having a major surface;

an emitter region of a second conductivity type in said semiconductor substrate on the major surface of said semiconductor substrate;

a collector region of a second conductivity type in said semiconductor substrate on the major surface of said semiconductor substrate, spaced from and surrounding said emitter region, and including a plurality of sides and corners;

an electrically insulating layer on the major surface of said semiconductor substrate and including a first penetrating hole extending to said collector region except at a first corner of said plurality of corners and a second penetrating hole extending to said emitter region;

a collector electrode contacting said collector region through said first penetrating hole and surrounding said emitter region except at said first corner;

an emitter electrode at the same level as said collector electrode and contacting said emitter region through said second penetrating hole; and an emitter wiring layer at the same level as said emitter electrode, disposed on said insulating layer, and extending from said emitter electrode across said first corner.

2. A lateral transistor comprising:

a semiconductor substrate of a first conductivity type and having a major surface; and a pair of transistor cells electrically connected in parallel to each other, each of said transistor cells comprising:

an emitter region of a second conductivity type in said semiconductor substrate on the major surface of said semiconductor substrate;

a collector region of a second conductivity type in said semiconductor substrate on the major surface of said semiconductor substrate, spaced from and surrounding said emitter region, and including a plurality of sides and corners;

an insulating layer on the major surface of said semiconductor substrate;

a collector electrode contacting said collector region through a first penetrating hole extending to said collector region, except at a first corner of said plurality of corners, in said insulating layer, said collector electrode surrounding said emitter region except at said first corner;

an emitter electrode at the same level as said collector electrode, contacting said emitter region through a second penetrating hole, extending to said emitter region, in said insulating layer; and an emitter wiring layer at the same level as said emitter electrode, disposed on said insulating layer, and extending from said emitter electrode across said first corner, wherein said first corners of said collector regions of said pair of transistor cells are located at the same position, said collector regions of said pair of transistor cells are continuous at said first corners, said collector electrodes of said pair of transistor cells are continuous at said first corners, and said emitter wiring layers of said pair of transistor cells are continuous at said first corners.

3. A lateral transistor comprising:

a semiconductor substrate of a first conductivity type and having a major surface; and four transistor cells electrically connected in parallel to each other, each of said transistor cells comprising:

an emitter region of a second conductivity type in said semiconductor substrate on the major surface of said semiconductor substrate;

a collector region of a second conductivity type in said semiconductor substrate on the major surface of said semiconductor substrate, spaced from and surrounding said emitter region, and including a plurality of sides and corners;

an insulating layer on the major surface of said semiconductor substrate;

a collector electrode contacting said collector region through a first penetrating hole, extending to said collector region except at a first corner of said plurality of corners, in said insulating layer, said collector electrode surrounding said emitter region except at said first corner;

an emitter electrode at the same level as said collector electrode, contacting said emitter region through a second penetrating hole, extending to said emitter region, in said insulating layer; and an emitter wiring layer at the same level as said emitter electrode, on said insulating layer, and extending from said emitter electrode across said first corner, wherein said first corners in said collector regions of said four transistor cells are located at the same position, said collector regions of said four transistor cells are continuous at said first corners, said collector electrodes of said four transistor cells are continuous at said first corners, and said emitter wiring layers of said four transistor cells are continuous at said first corners.

4. The lateral transistor of claim 1 wherein said first conductivity type is p-type and said second conductivity type is n-type.

5. The lateral transistor of claim 2 wherein said first conductivity type is p-type and said second conductivity type is n-type.

6. The lateral transistor of claim 3 wherein said first conductivity type is p-type and said second conductivity type is n-type.

7. A lateral transistor comprising:

a semiconductor substrate of a first conductivity type and having a major surface; and a plurality of transistor cells electrically connected in parallel to each other, each of said transistor cells comprising:

an emitter region of a second conductivity type in said semiconductor substrate on the major surface of said semiconductor substrate;

a collector region of a second conductivity type in said semiconductor substrate on the major surface of said semiconductor substrate, spaced from and surrounding said emitter region, and including a plurality of sides and corners;

an insulating layer on the major surface of said semiconductor substrate;

a collector electrode contacting said collector region through a first penetrating hole, extending to said collector region except at a first corner of said plurality of corners, in said insulating layer, said collector electrode surrounding said emitter region except at said first corner;

an emitter electrode at the same level as said collector electrode, contacting said emitter region through a second penetrating hole, extending to said emitter region, in said insulating layer; and an emitter wiring layer at the same level as said emitter electrode, disposed on said insulating layer, and extending from said emitter electrode across said first corner.

8. The lateral transistor of claim 7 wherein said first corners in said collector regions of neighboring transistor cells in said plurality of transistor cells are located at the same position, said collector regions of neighboring transistor cells in said plurality of transistor cells are continuous at said first corners, said collector electrodes of neighboring transistor cells in said plurality of transistor cells are continuous at said first corners, and said emitter wiring layers of neighboring transistor cells in said plurality of transistor cells are continuous at said first corners.

* * * * *